United States Patent
Ko et al.

(10) Patent No.: US 9,559,322 B2
(45) Date of Patent: Jan. 31, 2017

(54) QUANTUM DOTS, METHODS OF MANUFACTURING QUANTUM DOTS AND METHODS OF MANUFACTURING ORGANIC LIGHT EMITTING DISPLAY DEVICES USING THE SAME

(71) Applicants: SAMSUNG DISPLAY CO., LTD., Yongin, Gyeonggi-do (KR); INDUSTRY-ACADEMIA COOPERATION FOUNDATION, HONGIK UNIVERSITY, Seoul (KR)

(72) Inventors: Hee-Joo Ko, Suwon-si (KR); Hee-Sun Yang, Seoul (KR); Ki-Heon Lee, Seoul (KR); Jeong-Hoon Lee, Gwangmyeong-si (KR); Chang-Ho Lee, Suwon-si (KR)

(73) Assignees: Samsung Display Co., Ltd., Yongin-si (KR); Industry-Academia Cooperation Foundation, Hongik University, Seoul (KR)

( * ) Notice: Subject to any disclaimer, the term of this patent is extended or adjusted under 35 U.S.C. 154(b) by 0 days.

(21) Appl. No.: 14/244,874

(22) Filed: Apr. 3, 2014

(65) Prior Publication Data
US 2014/0302627 A1    Oct. 9, 2014

(30) Foreign Application Priority Data

Apr. 5, 2013 (KR) .................. 10-2013-0037292
Mar. 28, 2014 (KR) .................. 10-2014-0036760

(51) Int. Cl.
*H01L 33/06* (2010.01)
*H01L 33/26* (2010.01)
(Continued)

(52) U.S. Cl.
CPC ........... *H01L 51/502* (2013.01); *C09K 11/025* (2013.01); *C09K 11/565* (2013.01); *C09K 11/883* (2013.01); *H01L 51/5072* (2013.01)

(58) Field of Classification Search
CPC ........... H01L 33/18; B01J 13/22; B82Y 40/00; B82Y 30/00; B82Y 20/00; C09K 11/025; C09K 11/883; C09K 11/54; G02B 5/22
(Continued)

(56) References Cited

U.S. PATENT DOCUMENTS

| 2005/0236556 A1* | 10/2005 | Sargent ................. B82Y 10/00 250/214.1 |
| 2007/0204790 A1* | 9/2007 | Alkhawaldeh ......... B82Y 10/00 117/68 |

(Continued)

FOREIGN PATENT DOCUMENTS

| KR | 10-2011-0091691 A | 8/2011 |
| KR | 10-2012-0018865 A | 3/2012 |
| KR | 10-2012-0100617 A | 9/2012 |

*Primary Examiner* — Kimberly Rizkallah
*Assistant Examiner* — Brian Turner
(74) *Attorney, Agent, or Firm* — Lewis Roca Rothgerber Christie LLP

(57) ABSTRACT

In a method of manufacturing a quantum dot, a core may be formed using (utilizing) at least one cation precursor and at least one anion precursor. The core may be reacted with a shell forming precursor and a ligand forming precursor for more than one hour to form a shell enclosing the core and a ligand. A nanoparticle including the core, the shell and the ligand may be washed.

9 Claims, 3 Drawing Sheets

(51) Int. Cl.
*H01L 51/50* (2006.01)
*H01L 51/56* (2006.01)
*H01L 29/12* (2006.01)
*H01L 21/36* (2006.01)
*C09K 11/56* (2006.01)
*C09K 11/02* (2006.01)
*C09K 11/88* (2006.01)

(58) Field of Classification Search
USPC ............ 438/35; 252/519.3, 301.16; 423/299; 977/773, 774, 818, 896; 427/66
See application file for complete search history.

(56) References Cited

U.S. PATENT DOCUMENTS

| | | | |
|---|---|---|---|
| 2008/0217602 A1* | 9/2008 | Kahen | 257/13 |
| 2009/0152664 A1* | 6/2009 | Klem | H01L 27/14603 257/440 |
| 2009/0162448 A1* | 6/2009 | Dunwoody et al. | 424/490 |
| 2010/0140586 A1* | 6/2010 | Char | B82Y 10/00 257/14 |
| 2010/0213438 A1* | 8/2010 | Cho et al. | 257/13 |
| 2011/0175030 A1* | 7/2011 | Ren et al. | 252/301.6 S |
| 2011/0226991 A1* | 9/2011 | Treadway et al. | 252/301.6 S |
| 2013/0134366 A1* | 5/2013 | Battaglia et al. | 252/519.4 |
| 2014/0022779 A1* | 1/2014 | Su | H01L 33/504 362/231 |

\* cited by examiner

QUANTUM DOTS, METHODS OF MANUFACTURING QUANTUM DOTS AND METHODS OF MANUFACTURING ORGANIC LIGHT EMITTING DISPLAY DEVICES USING THE SAME

CROSS-REFERENCE TO RELATED APPLICATIONS

This application claims priority to and the benefit of Korean Patent Application No. 10-2013-0037292, filed on Apr. 5, 2013, in the Korean Intellectual Property Office (KIPO); and Korean Patent Application No. 10-2014-0036760, filed on Mar. 28, 2014, in the Korean Intellectual Property Office, the entire disclosure of each of the patent applications is incorporated herein by reference.

BACKGROUND

1. Field

Example embodiments of the invention relate to quantum dots, methods of manufacturing quantum dots and methods of manufacturing organic light emitting display devices using the same.

2. Description of the Related Art

A quantum dot may include a core, a shell surrounding the core, and a ligand chemically bonded to a surface of the shell. The quantum dot may be generally obtained by repeatedly washing a nanoparticle including the core, the shell and the ligand. If weak chemical bonding is generated between the shell and the ligand, however, the ligand may be detached from the nanoparticle while performing the washing process. Therefore, the quantum dot may have poor quantum efficiency, and also an organic light emitting display (OLED) device including an emitting layer formed using (utilizing) the quantum dot may have low luminance and poor current efficiency. Particularly, when the quantum dot is small in size, the quantum deficiency of the quantum dot may decrease in proportion to the decrease in size.

Meanwhile, since a blue quantum dot may have quantum efficiency lower than that of a green quantum dot or a red quantum dot, an OLED device may be required to have relatively high quantum efficiency when the OLED device includes the blue quantum dot.

SUMMARY

An aspect according to one or more example embodiments of the present invention is directed toward a quantum dot having a desired high quantum efficiency.

Another aspect according to one or more example embodiments of the present invention is directed toward a method of manufacturing a quantum dot having a desired high quantum efficiency.

Yet another aspect according to one or more example embodiments of the present invention is directed toward a method of manufacturing an organic light emitting display (OLED) device capable of ensuring high luminance and current efficiency with low current density.

According to one embodiment of the invention, in a method of manufacturing a quantum dot, a core may be formed using (utilizing) at least one cation precursor and at least one anion precursor. The core may be reacted with a shell forming precursor and a ligand forming precursor for more than about one hour to form a shell substantially enclosing the core and a ligand. A nanoparticle including the core, the shell and the ligand may be washed.

In the forming of the core according to example embodiments, a mixture may be formed using (utilizing) the at least one cation precursor selected from an element in Group XII and/or an element in Group XIII, an organic solvent and an unsaturated fatty acid. The mixture may be heated. The at least one anion precursor selected from an element in Group XV and/or an element in Group XVI may be added to the mixture to thereby react the anion precursor with the cation precursor.

In example embodiments, the cation precursor may include zinc (Zn), cadmium (Cd) and/or indium (In), and the anion precursor may include sulfur (S), selenium (Se), tellurium (Te) and/or phosphorous (P).

In example embodiments, the shell forming precursor may include at least one element in Group XVI.

In example embodiments, the ligand forming precursor may include at least one of oleic acid and trialkylphosphine.

In some example embodiments, when the core reacts with the shell forming precursor and the ligand forming precursor, a first shell forming precursor and the core may be reacted to form a first shell substantially enclosing the core. A second shell forming precursor, the core and the first shell may be reacted to form a second shell substantially enclosing the first shell. The ligand forming precursor, the core and the first and second shells may be reacted so that the ligand may be formed on a surface of the second shell.

In example embodiments, the first shell forming precursor may include at least one element in Group XVI.

In example embodiments, the second shell forming precursor may include at least one element in Group XII and at least one element in Group XVI.

In the washing of the nanoparticle according to example embodiments, the nanoparticle may be precipitated in a non-polar solvent. The nanoparticle may be centrifuged.

According to another embodiment of the invention, a quantum dot may include a core, a first shell and a second shell substantially enclosing the core, and a ligand on a surface of the second shell.

In example embodiments, the quantum dot may have a size above about 10 nm.

In example embodiments, the first shell may have a substantially gradient composition, and the second shell may have a substantially constant composition.

In example embodiments, each of the first and the second shells may include at least one element in Group XII and at least one element in Group XVI.

In example embodiments, the ligand may include oleate. Alternatively, the ligand may include oleate and trioctylphosphine.

In example embodiments, the core may include a reaction product of at least one cation precursor selected from an element in Group XII and an element in Group XIII, and at least one anion precursor selected from an element in Group XV and an element in Group XVI.

In example embodiments, the core may have a blue emission color or a green emission color.

According to still another embodiment of the invention, in a method of manufacturing an organic light emitting display device, an anode may be formed on a substrate, and a hole injection layer (HIL) may be formed on the anode. A hole transport layer (HTL) may be formed on the HIL. An emitting layer (EML) may be formed on the HTL. The EML may be formed using (utilizing) a quantum dot having a size above about 10 nm and including a core, a first shell and a second shell substantially enclosing the core, and a ligand formed on a surface of the second shell. An electron transport layer (ETL) may be formed on the EML, and a cathode may be formed on the ETL.

In example embodiments, the HTL may include polyvinylcarbazole.

In the forming of the EML according to example embodiments, the quantum dot may be dispersed on the HTL using (utilizing) a solvent including hexane.

According to example embodiments of the invention, a quantum dot having high quantum efficiency may be easily obtained by controlling a reaction for a shell and a ligand. For example, a ligand forming precursor including oleic acid and a shell forming precursor may be reacted with a core for more than about one hour, so that a shell having a gradient composition and a thick thickness and a ligand including oleate may be formed. Thus, a strong chemical bonding may be generated between the ligand and the shell, and the quantum dot may have a size larger than about 10 nm. In addition, the quantum dot may have high quantum efficiency. Moreover, an additional shell may be formed on a surface of the shell to form a quantum dot having higher quantum efficiency than that of the quantum dot which does not have an additional shell. In this case, the core affecting quantum efficiency and emitting characteristics of the quantum dot may be effectively protected by the additional shell, and thus the quantum dot may have and maintain high quantum efficiency even though a chemical bonding between the ligand and the shell is weak. When the EML of the OLED device is formed using (utilizing) the quantum dot in accordance with example embodiments, the OLED device may have high luminance and high current efficiency while ensuring low current density. When the OLED device includes the blue quantum dot in accordance with example embodiments, the OLED device may have quantum efficiency substantially the same as or greater than that of an OLED device including a green quantum dot or a red quantum dot.

BRIEF DESCRIPTION OF THE DRAWINGS

Example embodiments of the invention will be more clearly understood from the following detailed description taken in conjunction with the accompanying drawings.

FIG. 1 is a cross-sectional view illustrating a quantum dot in accordance with example embodiments of the invention;

FIG. 2 is a cross-sectional view illustrating a quantum dot in accordance with some example embodiments of the invention;

FIG. 3 is a flow chart illustrating a method of manufacturing a quantum dot in accordance with example embodiments of the invention;

FIG. 4 is a flow chart illustrating a method of manufacturing a quantum dot in accordance with some example embodiments of the invention; and FIG. 5 is a cross-sectional view illustrating a method of manufacturing an OLED in accordance with example embodiments of the invention.

DETAILED DESCRIPTION

Figure 1:
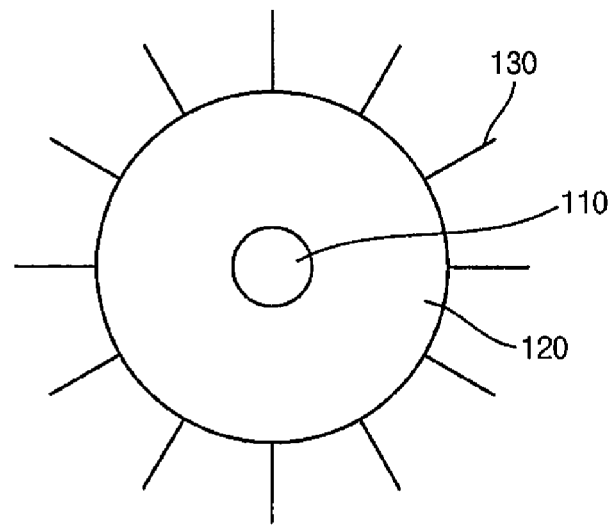
FIGS. 1 to 5 represent non-limiting, example embodiments as described herein.

Various example embodiments of the invention will be described more fully hereinafter with reference to the accompanying drawings, in which some example embodiments are shown. The invention may, however, be embodied in many different forms and should not be construed as limited to the example embodiments set forth herein. Rather, these example embodiments are provided so that this disclosure will be thorough and complete, and will fully convey the scope of the invention to those skilled in the art. In the drawings, the dimensions and relative sizes of layers and/or regions may be exaggerated for clarity. Like reference numerals refer to like elements throughout.

It will be understood that, although the terms first, second, third, etc. may be used herein to describe various elements, these elements should not be limited by these terms. These terms are used to distinguish one element from another. Thus, a first element discussed below could be termed a second element without departing from the teachings of the invention. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of the stated features, integers, steps, operations, elements, and/or components, but do not preclude the presence or addition of one or more other features, integers, steps, operations, elements, components, and/or groups thereof. As used herein, the term "substantially" is used as a term of approximation and not as a term of degree.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a quantum dot in accordance with example embodiments of the invention.

Referring to FIG. 1, a quantum dot 100 may include a core 110, a first shell 120 and a ligand 130. The quantum dot 100 may have a size above (greater than) about 10 nm, and have high quantum efficiency in proportion to a size thereof.

The core 110 may be located at a center of the quantum dot 100 and may have a substantially spherical shape. The core 110 may include at least one cation and at least one anion. The cation may include an element in Group XII and/or an element in Group XIII (of the Periodic Table of Elements). For example, the cation of the core 110 may include cadmium (Cd), zinc (Zn) and/or indium (In). The anion of the core 110 may include an element in Group XV and/or an element in Group XVI. For example, the anion may include sulfur (S), selenium (Se), tellurium (Te) and/or phosphorous (P). In example embodiments, the core 110 may be a binary core (including, e.g., CdSe, CdTe, CdS, ZnSe, ZnTe, InP, etc.), a ternary core (including, e.g., ZnCdS, ZnSeTe, CdSeS, ZnCdSe, ZnCdTe, etc.), or a quaternary core (including, e.g., ZnCdSeS, ZnCdSeTe, ZnCdTeS, etc.).

The core 110 may exhibit various colors in accordance with its composition, i.e., a cation content and/or an anion content. Accordingly, the quantum dot 100 may emit various colors of emission light such as blue, red, green, etc. In example embodiments, the quantum dot 100 may be a blue quantum dot or a green quantum dot.

The first shell 120 may enclose substantially a surface of the core 110, and may include at least one cation and at least one anion. The cation of the first shell 120 may include an element in Group XII, e.g., zinc (Zn) and/or cadmium (Cd). The anion of the first shell 120 may include an element in Group XVI, e.g., sulfur (S), etc. In example embodiments, the first shell 120 may be a binary shell (including, e.g., ZnS), or a ternary shell (e.g., ZnCdS).

In example embodiments, the first shell 120 may have a gradient composition. Different portions of the first shell 120 may have different cation contents and/or anion contents. That is, the cation content and/or the anion content may vary from an innermost portion of the first shell 120 to an outermost portion of the first shell 120. For example, when the first shell 120 includes zinc (Zn), cadmium (Cd) and sulfur (S), the zinc concentration in the first shell 120 may be substantially the lowest at the innermost portion and may be substantially the highest at the outermost portion. That is, the zinc concentration may increase substantially in proportion to an increase of a distance from the core 110.

In some example embodiments, the first shell 120 may have a substantially constant (same) composition. For example, each portion of the first shell 120 may have a substantially constant cation content and/or a substantially constant anion content.

Figure 2:
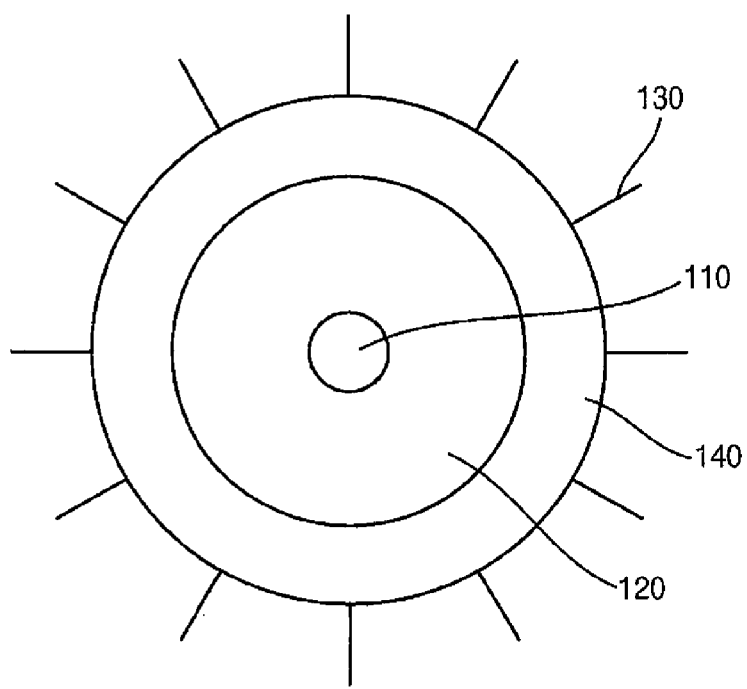

FIG. 2 is a cross-sectional view illustrating a quantum dot in accordance with some example embodiments of the invention As illustrated in FIG. 2, the quantum dot 100 may additionally include a second shell 140 substantially enclosing a surface of the first shell 120. In this case, a size of the quantum dot 100 may be increased because of the second shell 140, and a bonding between an electron and a hole in the core 110 may be specially (additionally) protected. Thus, the quantum dot 100 may ensure continuously higher quantum efficiency (higher quantum efficiency over a long time) than that of a quantum dot without a second shell.

The second shell 140 may include at least one cation and at least one anion. The cation of the second shell 140 may include an element in Group XII such as zinc (Zn), and the anion of the second shell 140 may include an element in Group XVI such as sulfur (S). In example embodiments, the second shell 140 may be a binary shell (including, e.g., ZnS). The second shell 140 may have a substantially constant composition. For example, each portion of the second shell 140 may have a substantially constant (the same) cation content and/or a substantially constant anion content. The second shell 140 may have a thickness of about 1.6 nm. In example embodiments, the second shell 140 may be substantially different from the first shell 120.

The ligand 130 may include an organic functional group. The ligand 130 may be provided on the surface of the first shell 120 or the surface of the second shell 140 such that the ligand 130 may be chemically bonded to the surface of the first shell 120 or the surface of the second shell 140. The organic functional group in the ligand 130 may include, e.g., oleate and/or trioctylphosphine (TOP).

In example embodiments, the ligand 130 including oleate may be provided on the surface of the first shell 120. Accordingly, a relatively strong chemical bonding may occur between the first shell 120 and the ligand 130, and the ligand 130 may not be detached from the surface of the first shell 120 during a repeated washing process for obtaining the quantum dot 100.

In some example embodiments, the ligand 130, including both oleate and TOP, may be provided on the surface of the second shell 140. In this case, even though a chemical bonding between the second shell 140 and the ligand 130 becomes weak, the quantum dot 100 may have continuously higher quantum efficiency because of the second shell 140. Alternatively, the ligand 130 including oleate only may be formed on the surface of the second shell 140, and thus the quantum dot 100 may have more improved quantum efficiency because of a relatively strong chemical bonding between the second shell 140 and the ligand 130.

Figure 3:
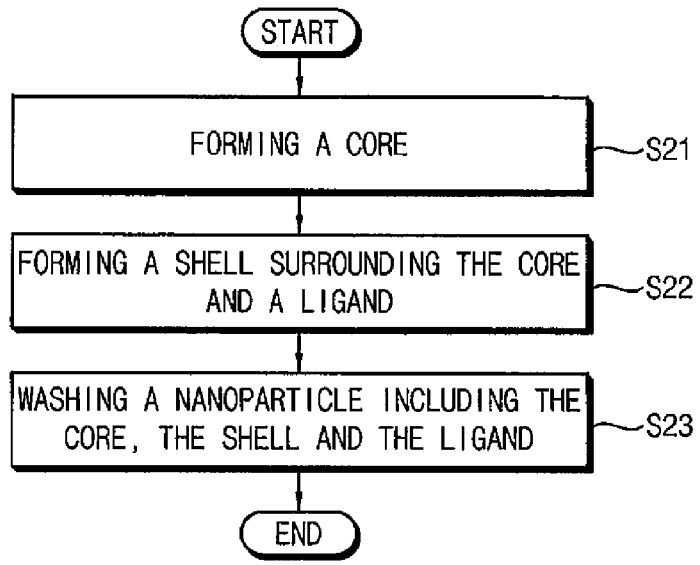

FIG. 3 is a flow chart illustrating a method of manufacturing a quantum dot in accordance with example embodiments of the invention.

Referring to FIG. 3, a core may be formed using (utilizing) at least one cation precursor and at least one anion precursor in act S21.

In example embodiments, the core may be formed by the following acts (steps). The cation precursor including an element in Group XII and/or an element in Group XIII, an organic solvent and an unsaturated fatty acid may be mixed to form a mixture. The mixture may be heated to a temperature of about 100° C. to about 350° C., and the anion precursor including an element in Group XV and/or an element in Group XVI may be added into the heated mixture to be reacted with the cation precursor.

The cation precursor may include, e.g., zinc acetylacetonate, zinc acetate, zinc iodide, zinc bromide, zinc fluoride, dimethyl zinc, diethyl zinc, cyanide zinc, zinc hydroxide, zinc carbonate, zinc oxide, zinc chloride, zinc sulfide, cadmium acetylacetonate, cadmium acetate, cadmium iodide, cadmium bromide, cadmium chloride, cadmium fluoride, dimethyl cadmium, diethyl cadmium, cadmium hydroxide, cadmium carbonate, cadmium oxide, indium acetylacetonate, indium acetate, indium iodide, indium bromide, indium chloride, indium hydroxide and/or indium carbonate.

The organic solvent may include a hydrocarbon such as 1-oatadecen (1-ODE), 1-nonadecene, cis-2-methyl-7-octadecene, 1-heptadecene, 1-hexadecene, 1-pentadecene, 1-tetradecene, 1-tridecene, 1-undecene, 1-dodecene, 1-decene, etc.

The unsaturated fatty acid may include a carboxylic acid such as lauric acid, palmitic acid, oleic acid, stearic acid, myristic acid, elaidic acid, eicosanoic acid, etc.

The anion precursor may be a mixture including a solvent and an element, e.g., sulfur (S), selenium (Se), tellurium (Te) and/or phosphorous (P). The solvent may include, e.g., an alkene such as 1-ODE, an alkylphosphine such as TOP, an alkylphosphine oxide such as trioctylphosphineoxide (TOPO), and/or amine.

In example embodiments, the core may be accordingly formed as a binary core (including, e.g., CdSe, CdTe, CdS, ZnSe, ZnTe, InP, etc.), a ternary core (including, e.g., ZnCdS, ZnSeTe, CdSeS, ZnCdSe, ZnCdTe, etc.), or a quaternary core (including, e.g., ZnCdSeS, ZnCdSeTe, ZnCdTeS, etc).

The quantum dot may have various colors of light emission (emit various light colors), e.g., blue, red, green, etc., in accordance with a color of the core, which may be controlled by changing a composition thereof, i.e., changing a content of the cation precursor and/or a content of the anion precursor for forming the core. Alternatively, a size of the core may be adjusted to control the color of emission light of the quantum dot. In example embodiments, a blue quantum dot or a green quantum dot may be obtained.

A shell forming precursor and a ligand precursor may be reacted with the core for about one hour to about 12 hours to form a shell substantially enclosing the core and a ligand in act S22. The ligand may be formed on a surface of the shell.

The shell forming precursor may include at least one element in Group XVI, e.g., sulfur (S), selenium (Se), etc. In example embodiments, the shell may be formed as a binary shell (including, e.g., ZnS), or a ternary shell (including, e.g., ZnCdS).

The time (reaction time) of a reaction between the core and the shell forming precursor may determine the thickness and the composition of the shell. That is, the shell may have a thicker thickness and a gradient composition in proportion to an increase of the reaction time. Thus, when shell forming precursor and the core are reacted for more than one hour, a nanoparticle including the core, the shell and the ligand may be formed with a size greater than (above) about 10 nm, and thus the quantum dot may have high quantum efficiency in proportion to the size thereof. Additionally, the shell may have different compositions from an innermost portion to an outermost portion.

In example embodiments, when the shell includes zinc (Zn), cadmium (Cd) and sulfur (S), the shell may have a zinc concentration increasing in proportion to an increase in a distance from the core. That is, the shell may have substantially and relatively the lowest zinc concentration at the innermost portion, and also substantially and relatively the highest zinc concentration at the outermost portion.

In some example embodiments, the shell may have a substantially constant composition from the innermost portion to the outermost portion.

The ligand forming precursor may include, e.g., oleic acid. In example embodiments, the ligand may include oleate derived from the oleic acid. In this case, a strong chemical bonding may be generated between the shell and the ligand, and thus the ligand may not be detached from the surface of the shell when performing a washing process for the nanoparticle.

The nanoparticle may be washed in act S23. The nanoparticle may be purified by the washing process, so that the quantum dot may be obtained In example embodiments, the nanoparticle may be precipitated in a non-polar solvent, and a centrifugal process may be performed using a mixed (complex) solvent to obtain the quantum dot. The non-polar solvent may include, e.g., ethanol or acetone, and the complex solvent may include, e.g. acetone and chloroform. Such a washing process may be repeatedly performed e.g., more than three times.

As described above, the quantum dot having high quantum efficiency may be easily formed by controlling the reaction for forming the shell and the ligand. For example, the ligand forming precursor including oleic acid and the shell forming precursor may be reacted with the core for more than one hour, so that the shell may have a gradient composition and a relatively thicker thickness, and the ligand may include oleate. Thus, a strong chemical bonding may be generated between the ligand and the shell, and the quantum dot may have a large size above about 10 nm. As a result, the quantum dot may ensure high quantum efficiency.

According to example embodiments, a blue quantum dot may be obtained by performing the above-described processes, so the blue quantum dot may have a quantum efficiency substantially the same as or higher than that of a red quantum dot or a green quantum dot.

Figure 4:
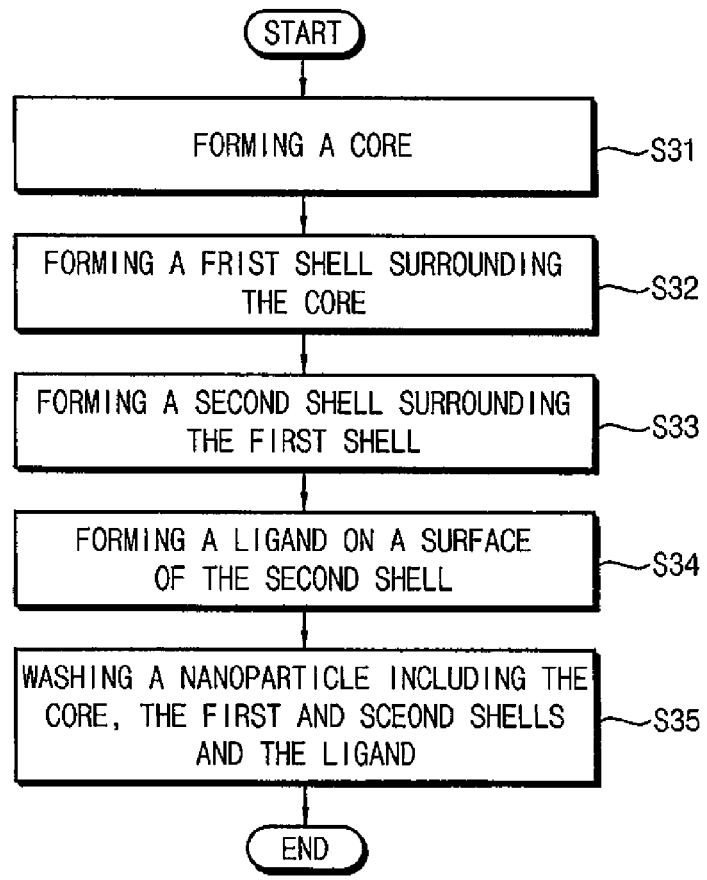

FIG. 4 is a flow chart illustrating a method of manufacturing a quantum dot in accordance with some example embodiments of the invention. The quantum dot may be formed by performing processes substantially the same as or similar to those described with reference to FIG. 3.

Referring to FIG. 4, processes substantially the same as or similar to those in act S21 may be performed to form a core in act S31. The resulting core may be substantially the same as the core described with reference to FIG. 3.

Then, processes substantially the same as or similar to those in act S22 may be performed to form a first shell substantially enclosing the core in act S32. That is, a first shell forming precursor substantially the same as the shell forming precursor described with reference to FIG. 3 may be reacted with the core, and thus the first shell substantially the same as the shell described with reference to FIG. 3 may be formed.

A second shell forming precursor may be reacted with the core and the first shell to form a second shell substantially enclosing the first shell in act S33. The resulting quantum dot may have a size substantially larger than that of the quantum dot described with reference to FIG. 3, and also a bonding between an electron and a hole in the core may be more effectively protected. Thus, the quantum dot may ensure a quantum efficiency substantially higher than that of the quantum dot described with reference to FIG. 3.

The second shell forming precursor may include at least one cation precursor and at least one anion precursor. In example embodiments, the cation precursor may include an element in Group XII such as zinc (Zn), and the anion precursor may include an element in Group XVI such as sulfur (S).

In example embodiments, the second shell may be formed as a binary shell including, e.g., ZnS. The second shell may have a substantially constant composition and a thickness of about 1.6 nm. The second shell may be substantially different from the first shell. The thickness of the second shell may vary in accordance with a time of reaction among the core, the first shell and the second shell forming precursor, so that the thickness may not be limited thereto but be changed easily in accordance with quantum characteristics of a desired quantum dot.

Referring now to FIG. 4, a ligand forming precursor may be reacted with the core and the first and second shells to form a ligand on a surface of the second shell in act S34.

The ligand forming precursor may include, e.g., oleic acid and a trialkylphoshine. In example embodiments, the ligand may include oleate derived from oleic acid or TOP derived from trialkylphoshine. In this case, even though a chemical bonding between the ligand and the second shell is weak, the quantum dot may not have reduced quantum efficiency because of the second shell.

In some example embodiments, the ligand forming precursor may include oleic acid only, and thus the ligand may include oleate only. Here, a strong chemical bonding may be generated between the ligand and the second shell, so that the quantum dot may have more improved quantum efficiency.

Then, processes substantially the same as or similar to those in act S23 may be performed to wash a nanoparticle including the core, the first shell, the second shell and the ligand in act S35. Therefore, the nanoparticle may be purified and the quantum dot may be obtained.

As described above, the second shell may be additionally provided in manufacturing of the quantum dot, and thus the quantum dot may ensure higher quantum efficiency. That is, the core affecting quantum efficiency and emitting characteristics of the quantum dot may be more effectively protected by the second shell, and thus the quantum dot may have continuously higher quantum efficiency although a chemical bonding between the ligand and the second shell becomes weak.

Figure 5:
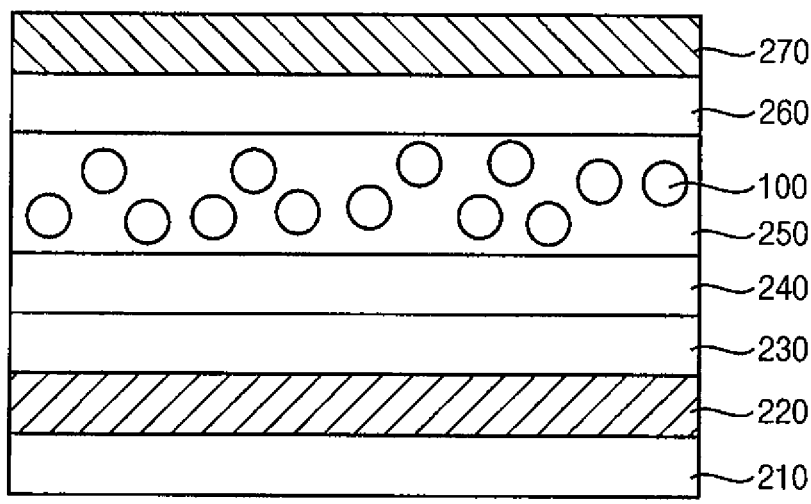

FIG. 5 is a cross-sectional view illustrating a method of manufacturing an organic light emitting display (OLED) device in accordance with example embodiments of the invention.

Referring to FIG. 5, an anode 220, a hole injection layer (HIL) 230 and a hole transport layer (HTL) 240 may be sequentially formed on a substrate 210.

In example embodiments, a first conductive layer may be formed on the substrate 210 by a deposition process (such as a sputtering process), and the first conductive layer may be patterned to form the anode 220. The first conductive layer may be formed using (utilizing) metal or metal oxide, e.g., indium tin oxide (ITO), zinc oxide, indium oxide, tin oxide, indium zinc oxide, etc.

Then, a cleaning process may be performed on the substrate 210 on which the anode 220 is formed. In example embodiments, the cleaning process may include a wet cleaning process executed using (utilizing) deionized water (DI), acetone and/or isopropanol, and/or a UV ozone treatment process.

The HIL 230 may be formed on the anode 220 by coating a first composition including a hole injection material, and by soft-baking the substrate 210 on which the first composition is coated. Examples of the hole injection material may include, e.g., poly(3,4-ethylenedioxylenethiophene) (PEDOT), polystyrene sulfonate (PSS), etc. In example embodiments, the HIL 230 may be formed by spin coating, inkjet printing, nozzle printing, spray coating, slit coating, dip coating, etc. The HIL 230 may have a thickness of about 20 nm.

The HTL 240 may be formed on the HIL 230 by coating a second composition including a hole transport material, and by soft-baking the substrate 210 on which the second composition is coated. Examples of the hole transport material may include, e.g., polyvinylcarbazole (PVK), N,N'-diphenyl-N,N'-bis(1-naphthylphenyl)-1,1'-biphenyl-4,4'-diamine (NPD), poly-TPD(poly(N,N'-bis(4-butylphenyl)-N—N'-bis(phenyl-benzidine)), poly-TFB(poly[(9,9-dioctylfluorenyl-2,7-diyl)-co-(4,4'-(N-(4-sec-butylphenyl)) diphenyl-amine)]), poly(1,4-phenylenevinylene) (PPV), etc. In example embodiments, the HTL 240 may be formed by spin coating, inkjet printing, nozzle printing, spray coating, slit coating, dip coating, etc. The HTL 240 may have a thickness of about 20 nm.

The substrate 210 may include, e.g., a glass substrate, a quartz substrate, a plastic substrate, a ceramic substrate, a semiconductor substrate, etc. Alternatively, the substrate 210 may include a flexible substrate.

An emitting layer (EML) 250 may be formed on the HTL 240. In example embodiments, the EML 250 may be obtained by dispersing a quantum dot 100 in a solvent such as water, hexane, chloroform, toluene, etc. to form a mixture, and then by coating the mixture on the HTL 240 through spin coating. When the HTL 240 includes PVK as a hole transport material, the HTL 240 may be dissolved in a solvent including chloroform and/or toluene. Thus, the solvent (for dispersing the quantum dot 100) may include hexane without chloroform and/or toluene.

After performing processes substantially the same as or similar to those described with reference to FIG. 3 or FIG. 4, the quantum dot 100 may be obtained. The quantum dot 100 may be substantially the same as that described with reference to FIG. 1 or FIG. 2. Accordingly, the EML 250 may have high emitting characteristics, and thus the OLED 200 device including the EML 250 may have high luminance and high current efficiency with low current density.

An electron transport layer (ETL) 260 and a cathode 270 may be sequentially formed on the EML 250. The ETL 260 may be formed on the EML 250 by coating a composition including an electron transport material, and then by soft-baking the substrate 210 on which the composition is coated. Examples of the electron transport material may include a ZnO quantum dot and/or a TiO$_2$ nanoparticle. Alternatively, the electron transport material may include, 2,9-dimethyl-4,7-diphenyl-1,10-phenanhro-line (BCP) and/or 1,3,5-tris (N-phenylbenzimidazol-2,yl)benzene (TPBI). In example embodiments, the ETL 260 may be formed by spin coating, inkjet printing, nozzle printing, spray coating, slit coating, dip coating, etc. The ETL 260 may have a thickness of about 50 nm.

A second conductive layer may be formed on the ETL 260 by a deposition process such as a thermal deposition process. The second conductive layer may be patterned to form the cathode 270 on the ETL 260. The second conductive layer may be formed using metal, metal alloy or metal oxide. Examples of the metal may include calcium (Ca), aluminum (Al), magnesium (Mg), silver (Ag), barium (Ba), etc.

As described above, the EML 250 may be formed using the quantum dot 100 in accordance with example embodiments, so that the OLED device 200 including the EML 250 may have high luminance and high current efficiency with low current density. For example, the OLED device 200 including a blue quantum dot prepared in accordance with example embodiments may have good electrical characteristics substantially the same as or superior than that of an OLED device including a green quantum dot or a red quantum dot. The HTL 240 may be formed using (utilizing) PVK, which is an affordable hole transport material, so that the OLED device 200 including the HTL 240 may have a competitive price.

Example 1

1 mmol of cadmium oxide and 10 mmol of zinc acetate were added into a three neck flask, and 15 ml of 1-ODE and 7 ml of oleic acid were also added therein to form a first mixture. The first mixture was heated to a temperature of about 150° C. under a vacuum condition, and then heated again to a temperature of about 310° C. under an argon (Ar) atmosphere. 1.6 mmol of sulfur powder was added to 2.4 ml of 1-ODE to form a second mixture, and then the second mixture was added to the heated first mixture to cause a reaction therebetween for about 12 min. Thus, a ZnCdS core was formed. After 4 mmol of sulfur powder was added to 5 ml of oleic acid to form a third mixture, the third mixture was added dropwise onto a surface of the core to cause a react therebetween. The reaction was maintained for about one hour. Hence, a nanoparticle including a ZnS shell or a ZnCdS shell and an oleate ligand was formed. The nanoparticle was precipitated in acetone, and a centrifugal process was performed using (utilizing) a complex solvent including hexane and ethanol. Accordingly, a blue quantum dot having a size of about 12 nm was obtained. The blue quantum dot included the core, the shell having a gradient composition and the ligand.

Example 2

Except that a reaction between a third mixture and a core was maintained for about 2 hours, processes substantially the same as or similar to those of Example 1 were performed to thereby obtain a quantum dot.

Example 3

Except that a reaction between a third mixture and a core was maintained for about 4 hours, processes substantially the same as or similar to those of Example 1 were performed to thereby obtain a quantum dot.

Example 4

Except for the forming of a first mixture using (utilizing) 0.14 mmol of cadmium acetate and 3.41 mmol of zinc oxide and the forming of a second mixture using (utilizing) 5 ml of TOP, 5 ml of oleic acid, 5 mmol of selenium powder and 5 mmol of sulfur powder, processes substantially the same as or similar to those of Example 1 were performed. Thus, a green quantum dot having a size of about 10 nm was obtained. The green quantum dot included a CdSe core, a ZnCdS shell having gradient composition and oleate, and TOP ligands.

Example 5

Processes substantially the same as or similar to those of Example 4 were performed to form a first nanoparticle including a CdSe core having a green emission color and a ZnCdS first shell having a gradient composition. Then, 2.36 mol of Zn acetate dehydrate was added in 1 ml of oleic acid and 4 ml of 1-ODE to form a fourth mixture, and the fourth mixture was reacted with the first nanoparticle at a temperature of about 310° C. This reaction was maintained until a temperature was decreased to about 270° C. After 9.65 mmol of sulfur powder was added to 5 ml of TOP to form a fifth mixture, the fourth and fifth mixtures and the first nanoparticle were reacted for about 20 minutes. Thus, a ZnS second shell enclosing the first nanoparticle and having a thickness of about 1.6 nm was formed, and ligand including oleate and TOP was formed on a surface of the second shell. Processes substantially the same as or similar to those of Example 1 were performed to wash a second nanoparticle including the core, the first shell, the second shell and the ligand. As a result, a green quantum dot having a size of about 13 nm was obtained. The green quantum dot included the core, the first shell, the second shell and the ligand.

Comparative Example 1

Except that a reaction between a third mixture and a core was maintained for about 40 min, processes substantially the same as or similar to those of Example 1 were performed to thereby obtain a quantum dot.

Comparative Example 2

Except for the forming of a third mixture using (utilizing) TOP substituted for oleic acid, processes substantially the same as or similar to those of Example 1 were performed. Thus, a blue quantum dot having a size of 12 nm was obtained. The blue quantum dot included a ZnCdS core, a ZnCdS shell having a gradient composition, and a TOP ligand.

Comparative Example 3

Except that a reaction between a third mixture and a core was maintained for about 4 hours and the forming of the third mixture using TOP substituted for oleic acid, processes substantially the same as or similar to those of Example 1 were performed to thereby obtain a quantum dot.

Example 6

ITO was deposited on a substrate to form a first conductive layer, and the first conductive layer was patterned to form an anode. The substrate having the anode thereon was cleaned using (utilizing) acetone and methanol for about 20 minutes, and an ozone treatment process was performed on the substrate. A compound including PEDOT-PSS (clevios PH500) having relatively high conductivity and PEDOT-PSS (clevios AI4083) having relatively low conductivity was spin-coated on the cleaned substrate, and the substrate on which the compound was coated was soft-backed in a glovebox having $N_2$ atmosphere for about 30 minutes at a temperature of about 110° C. to form a HIL on the anode. 0.05 g of PVK was dissolved in 5 ml of chlorobenzene to form 1.1 vol % of PVK liquid, and then the PVK liquid was spin-coated on the HIL at 3,000 rpm for about 60 sec. The substrate on which the PVK liquid was spin-coated was soft-backed in a glovebox having $N_2$ atmosphere for about 30 min at a temperature of about 150° C. to form a HTL on the HIL. The HTL had a thickness of about 20 nm. Thereafter, a quantum dot in accordance with Example 1 was dispersed in hexane to form a first quantum liquid having a concentration of about 15 mg/ml, and the first quantum liquid was spin-coated on the HTL at 2,000 rpm for about 20 sec to form an EML having a thickness of about 20 nm. A ZnO quantum dot was dispersed in ethanol to form a second quantum liquid having a concentration of about 20 mg/ml, and the second quantum liquid was spin-coated at 1,500 rpm for about 60 seconds. The substrate on which the second quantum liquid was spin-coated was soft-backed in a glovebox having $N_2$ atmosphere for about 30 min at a temperature of about 110° C. to form an ETL on the HTL. The ETL had a thickness of about 50 nm. Aluminum was deposited on the ETL by a thermal deposition process to form a second conductive layer having a thickness of about 100 nm, and the second conductive layer was patterned to form a cathode. As a result, an OLED device including a blue quantum dot was manufactured.

Example 7

Except for the forming of an EML using (utilizing) a quantum dot prepared in accordance with Example 2, processes substantially the same as or similar to those of Example 6 were performed to thereby manufacture an OLED device.

Example 8

Except for the forming of an EML using (utilizing) a quantum dot prepared in accordance with Example 3, processes substantially the same as or similar to those of Example 6 were performed to thereby manufacture an OLED device.

Example 9

Except for the forming of an EML using (utilizing) a quantum dot prepared in accordance with Example 4, processes substantially the same as or similar to those of Example 6 were performed to thereby manufacture an OLED device.

Example 10

Except for the forming of an EML using (utilizing) a quantum dot prepared in accordance with Example 5, processes substantially the same as or similar to those of Example 6 were performed to thereby manufacture an OLED device.

Comparative Example 4

Except for the forming of an EML using (utilizing) a quantum dot prepared in accordance with Comparative Example 3, processes substantially the same as or similar to those of Example 6 were performed to manufacture an OLED device.

Evaluation of Quantum Efficiencies of Quantum Dots According to Reactions for Formations of Shells and Ligands To evaluate quantum efficiencies of quantum dots in accordance with a reaction for the formation of a shell and a ligand, sizes of quantum dots prepared according to Examples 1 to 3 and Comparative Example 1 were measured using (utilizing) a transmission electron microscope (TEM), and their quantum efficiencies were also measured. The results are shown in Table 1.

TABLE 1

| Quantum Dot | Size (nm) | Quantum Efficiency (%) |
| --- | --- | --- |
| Example 1 | 10-12 | 73 |
| Example 2 | 10-12 | 87 |
| Example 3 | 12-13 | 109 |
| Comparative Example 1 | 8 | 38 |

As shown in Table 1, quantum dots prepared according to Examples 1 to 3 had sizes larger than (or equal to) about 10 nm and high quantum efficiencies. Thus, a quantum dot may have a large size, a uniform size distribution and a spherical shape in proportion to the increase of a reaction time. In addition, the quantum efficiency of the quantum dot may be increased proportionally as the reaction time increases.

Evaluation of Quantum Efficiencies of Quantum Dots According to Ligands

To evaluate quantum efficiencies of quantum dots in accordance with ligands, quantum dots prepared according to Example 1 and Comparative Example 2 were repeatedly washed, and their quantum efficiencies were measured. The results are shown in the following Table 2.

TABLE 2

| Quantum Dot | The repeated number of Washing Process (time) | Quantum Efficiency (%) |
| --- | --- | --- |
| Example 1 | 0 | 73 |
| | 1 | 73 |
| | 2 | 73 |
| | 3 | 73 |
| Comparative Example 2 | 0 | 73 |
| | 1 | 69 |
| | 2 | 58 |
| | 3 | 54 |

As shown in Table 2, while the quantum efficiency of the quantum dot prepared according to Example 1 was not reduced after repeatedly performing the washing process, the quantum efficiency of the quantum dot prepared according to Comparative Example 2 was rapidly reduced in proportion to the number of the washing process. Thus, a strong chemical bonding may be generated between the shell and the ligand of the quantum dot prepared according to Example 1, and the quantum dot according to Example 1 may continuously have good quantum characteristics.

Evaluation of Quantum Efficiencies of Quantum Dots According to an Additional Shell To evaluate quantum efficiencies of quantum dots as an additional shell was formed, the initial quantum efficiencies of the quantum dots prepared according to Examples 4 and 5 were measured, and their changes according to repeatedly performing a washing process were measured. The results are shown in Table 3.

TABLE 3

| Quantum Dot | The repeated number of Washing Process (time) | Quantum Efficiency (%) |
| --- | --- | --- |
| Example 4 | 0 | 43 |
| | 2 | 38 |
| | 4 | 36 |
| | 6 | 35 |
| | 8 | 34 |
| Example 5 | 0 | 84 |
| | 2 | 84 |
| | 4 | 84 |
| | 6 | 84 |
| | 8 | 84 |

As shown in Table 3, the quantum dot prepared according to Examples 5 had quantum efficiency higher than that of the quantum dot prepared according to Example 4, which was not reduced after repeatedly performing the washing process. Thus, a quantum dot including an additional shell may have more improved quantum efficiency while the quantum efficiency of the quantum dot including the additional shell may not be reduced even though chemical bonding between a shell and a ligand becomes weak.

Evaluation I of Properties of OLED Devices According to EMLs

To evaluate properties of OLED devices in accordance with emission characteristics of EMLs, maximum current efficiencies and maximum external quantum efficiencies of the OLED devices prepared according to Examples 6 to 10 were measured. The results are shown in the following Table 4.

TABLE 4

| OLED device | Maximum Current Efficiency (Cd/A) | Maximum External Quantum Efficiency (%) |
| --- | --- | --- |
| Example 6 | 0.4 | 1.1 |
| Example 7 | 0.7 | 1.8 |
| Example 8 | 2.2 | 7.1 |
| Example 9 | 2.1 | 0.5 |
| Example 10 | 46.4 | 12.6 |

As shown in Table 4, the maximum current efficiencies and the maximum external quantum efficiencies of the OLED devices including the EMLs were increased in proportion to the increase of a reaction time for forming the shells and ligands of the quantum dot included in the EMLs (refer to the data according to Examples 6 to 8). In addition, the OLED devices manufactured using (utilizing) the quantum dots including the additional shells had the maximum current efficiencies and maximum external quantum efficiencies higher than those of the OLED device manufactured using (utilizing) a quantum dot including no additional shell (refer to the data according to Examples 9 to 10).

Thus, an EML may have increased emission characteristics in proportion to the increase of reaction time, and also have more increased emission characteristics when a quantum dot additionally includes an additional shell. As a result, an OLED device including such EML may have good electrical characteristics, e.g., high luminance, high current efficiency, low current density, etc.

Evaluation II of Properties of OLED Devices According to EMLs

To evaluate properties of OLED devices in accordance with emission characteristics of EMLs, maximum luminances and maximum current efficiencies of the OLED devices prepared according to Examples 8 to 10 and Comparative Example 4 were measured. The results are shown in Table 5.

TABLE 5

| OLED device | Maximum Luminance (Cd/A) | Maximum Current Efficiency (Cd/A) |
| --- | --- | --- |
| Example 8 | 2624 | 2.2 |
| Example 9 | 9010 | 2.1 |
| Example 10 | 85700 | 46.4 |
| Comparative Example 4 | 379 | 0.3 |

As shown in Table 5, while the OLED device prepared according to Comparative Example 4 exhibited low luminance and low current efficiency, the OLED device according to Example 8 had about seven times higher maximum luminance and about ten times higher maximum current efficiency than those of the OLED device according to Comparative Example 4. In addition, the OLED prepared according to Example 10 had about ten times higher maximum luminance and thirteen times higher maximum current efficiency than those of the OLED device according to Example 9.

Thus, electrical characteristics of an OLED device may be increased in accordance with a ligand of a quantum dot used for formation of an EML in the OLED device, i.e., in proportion to the increase of chemical bonding between the ligand and the shell of the quantum dot. Additionally, when a quantum dot including an additional shell is used (utilizing) to form an EML, an OLED device may have more improved electrical characteristics.

According to example embodiments, the quantum dot of the invention may be employed in various display devices including an OLED device, an LCD device, a transparent flexible display device or other display devices so as to improve the quality of images and electrical properties.

The foregoing is illustrative of example embodiments and is not to be construed as limiting thereof. Although a few example embodiments have been described, those skilled in the art will readily appreciate that many modifications are possible in the example embodiments without materially departing from the novel teachings and enhancements of the invention. Accordingly, all such modifications are intended to be included within the scope of the invention as defined in the claims, and equivalents thereof. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims, and equivalents thereof.

What is claimed is:

1. A method of manufacturing a quantum dot, the method comprising:
    forming a core utilizing at least one cation precursor and at least one anion precursor;
    reacting the core with a mixture comprising a shell forming anion precursor solution without an additional cation precursor for more than one hour to form a first shell surrounding the core, the anion of the shell forming anion precursor being one or more elements in Group XVI;
    washing a nanoparticle comprising the core and the first shell;
    reacting a second shell forming precursor with the core and the first shell to form a second shell enclosing the first shell; and
    reacting a ligand forming precursor with the core and the first and second shells to form a ligand on a surface of the second shell, the ligand forming precursor being oleic acid or a mixture of oleic acid and trialkylphosphine.

2. The method of claim 1, wherein the forming of the core comprises:
    forming a mixture comprising the at least one cation precursor, an organic solvent and an unsaturated fatty acid, the cation precursor being selected from the group consisting of an element in Group XII and an element in Group XIII;
    heating the mixture; and
    adding the at least one anion precursor to the mixture to react the anion precursor and the cation precursor, the anion precursor being selected from the group consisting of an element in Group XV and an element in Group XVI.

3. The method of claim 1, wherein the cation precursor comprises zinc (Zn), cadmium (Cd) and/or indium (In), and the anion precursor comprises sulfur (S), selenium (Se), tellurium (Te) and/or phosphorous (P).

4. The method of claim 1, wherein the ligand forming precursor is oleic acid.

5. The method of claim 1, wherein the second shell forming precursor comprises at least one element in Group XII and at least one element in Group XVI.

6. The method of claim 1, wherein the washing of the nanoparticle comprises:
    precipitating the nanoparticle in a non-polar solvent; and
    centrifuging the nanoparticle.

7. A method of manufacturing an organic light emitting display device, the method comprising:
    forming an anode on a substrate;
    forming a hole injection layer (HIL) on the anode;
    forming a hole transport layer (HTL) on the HIL;
    forming an emitting layer (EML) on the HTL utilizing a quantum dot having a size above about 10 nm, the quantum dot comprising a core, a first shell and a second shell enclosing the core, and a ligand on a surface of the second shell, the ligand being oleate or a mixture of oleate and trioctylphosphine;
    forming an electron transport layer (ETL) on the EML; and
    forming a cathode directly on the ETL, wherein
    the forming of the emitting layer comprises reacting the core with a mixture comprising a shell forming anion precursor solution without an additional cation precursor for more than one hour to form the first shell surrounding the core, the anion of the shell forming anion precursor being one or more elements in Group XVI.

8. The method of claim 7, wherein the HTL comprises polyvinylcarbazole.

9. The method of claim 7, wherein the forming of the EML on the HTL comprises dispersing the quantum dot on the HTL utilizing a solvent comprising hexane.

* * * * *